(12) United States Patent
Chen et al.

(10) Patent No.: US 10,720,589 B2
(45) Date of Patent: Jul. 21, 2020

(54) FLEXIBLE DISPLAY DEVICE AND MANUFACTURING METHOD THEREOF

(71) Applicant: Wuhan China Star Optoelectronics Semiconductor Display Technology Co., Ltd., Wuhan, Hubei (CN)

(72) Inventors: Bao Chen, Guangdong (CN); Shu-Ru Lin, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 74 days.

(21) Appl. No.: 16/113,420

(22) Filed: Aug. 27, 2018

(65) Prior Publication Data

US 2019/0305232 A1    Oct. 3, 2019

Related U.S. Application Data

(63) Continuation of application No. PCT/CN2018/084086, filed on Apr. 23, 2018.

(30) Foreign Application Priority Data

Apr. 3, 2018   (CN) .......................... 2018 1 0291537

(51) Int. Cl.
*H01L 51/00* (2006.01)
*H01L 51/56* (2006.01)
(Continued)

(52) U.S. Cl.
CPC ............ *H01L 51/0097* (2013.01); *B32B 7/12* (2013.01); *B32B 15/04* (2013.01); *H01L 51/56* (2013.01);
(Continued)

(58) Field of Classification Search
CPC .................................................. H01L 51/0097
See application file for complete search history.

(56) References Cited

U.S. PATENT DOCUMENTS 9,276,055 B1 *   3/2016   Son ..................... H01L 27/3288
9,966,340 B2 *   5/2018   Zhang ..................... H01L 27/12
(Continued)

FOREIGN PATENT DOCUMENTS

CN         106548713 A       3/2017
CN         106796364 A       5/2017
(Continued)

OTHER PUBLICATIONS

G. Wu et al., Dual-phase nanostructuring as a route to high-strength magnesium alloys, May 4, 2017, Nature, vol. 545, pp. 80-93. (Year: 2017).*

(Continued)

*Primary Examiner* — Victoria K. Hall
(74) *Attorney, Agent, or Firm* — Leong C. Lei

(57) ABSTRACT

The present disclosure relates to a flexible display device, including at least two non-bending regions and at least one bendable region configured between the two adjacent non-bending regions. A stress buffering layer is configured on the bendable region. The stress buffering layer is configured to buffer a stress generated from the flexible display device when the flexible display device is in a bending state to maintain the flexible display device to be in a stable state, so as to simplified the structure of the flexible display device. The present disclosure further relates to a manufacturing method of the flexible display device.

15 Claims, 9 Drawing Sheets

(51) Int. Cl.
   *B32B 7/12*    (2006.01)
   *B32B 15/04*   (2006.01)
(52) U.S. Cl.
   CPC ... *B32B 2457/20* (2013.01); *H01L 2251/5338* (2013.01)

(56) References Cited

U.S. PATENT DOCUMENTS

| | | | | |
|---|---|---|---|---|
| 10,517,196 | B2* | 12/2019 | Chen | H01L 51/0097 |
| 10,553,665 | B2* | 2/2020 | Hwang | H01L 27/3276 |
| 10,557,781 | B2* | 2/2020 | Han | G01N 3/04 |
| 10,559,767 | B2* | 2/2020 | Li | H01L 51/5246 |
| 10,575,415 | B2* | 2/2020 | Shin | H05K 5/0017 |
| 2015/0147532 | A1* | 5/2015 | Nam | G02B 26/005 |
| | | | | 428/172 |
| 2016/0192478 | A1 | 6/2016 | Kuo | |
| 2016/0338219 | A1* | 11/2016 | Seo | G06F 1/1652 |
| 2017/0084673 | A1* | 3/2017 | Lee | H01L 27/3244 |
| 2017/0200678 | A1* | 7/2017 | Zhang | H01L 27/12 |
| 2017/0222179 | A1* | 8/2017 | Park | H01L 27/3244 |
| 2018/0027651 | A1* | 1/2018 | Lim | H05K 1/0281 |
| | | | | 361/749 |
| 2018/0175310 | A1* | 6/2018 | Lee | H01L 51/5253 |
| 2018/0301520 | A1* | 10/2018 | Jin | H01L 27/3223 |
| 2018/0315809 | A1* | 11/2018 | Kim | H01L 51/0097 |
| 2018/0315951 | A1* | 11/2018 | Seong | H01L 51/5237 |
| 2018/0356917 | A1* | 12/2018 | Lee | G06F 3/044 |
| 2018/0375040 | A1* | 12/2018 | Li | G09F 9/301 |
| 2019/0013493 | A1* | 1/2019 | Sonoda | H01L 51/56 |
| 2019/0075688 | A1* | 3/2019 | Chen | H05K 7/20954 |
| 2019/0090364 | A1* | 3/2019 | Shin | H05K 5/0226 |
| 2019/0140197 | A1* | 5/2019 | Zhao | H01L 51/0097 |
| 2019/0144714 | A1* | 5/2019 | Hu | C09J 175/04 |
| | | | | 428/174 |
| 2019/0154555 | A1* | 5/2019 | Han | G01N 3/20 |
| 2019/0156708 | A1* | 5/2019 | Li | H01L 51/0097 |
| 2019/0173041 | A1* | 6/2019 | Large | H01L 51/524 |
| 2019/0229282 | A1* | 7/2019 | Zhang | H01L 51/0097 |
| 2019/0363153 | A1* | 11/2019 | Matsui | H01L 51/50 |
| 2019/0372034 | A1* | 12/2019 | Kaneko | H01L 27/3276 |
| 2019/0380217 | A1* | 12/2019 | Cosgrove | H05K 5/0017 |
| 2020/0001577 | A1* | 1/2020 | Woody, V | B32B 17/1077 |
| 2020/0067000 | A1* | 2/2020 | Li | H05K 1/0393 |

FOREIGN PATENT DOCUMENTS

| | | |
|---|---|---|
| CN | 106910823 A | 6/2017 |
| CN | 106920820 A | 7/2017 |
| CN | 107104200 A | 8/2017 |
| CN | 107154416 A | 9/2017 |
| CN | 108447403 A | 8/2018 |
| KR | 20140022180 A | 2/2014 |

OTHER PUBLICATIONS

Machine translation, Gang, Korean Pat. Pub. No. 10-2014-0022180, translation date: Jan. 6, 2020, KIPO, all pages. (Year: 2020).*
Machine translation, Zhai, Chinese Pat. Pub. No. 107104200, translation date: Jan. 6, 2020, Espacenet, all pages. (Year: 2020).*
G. Wu et al, Dual-phase nanostructuring as a route to high-strength magnesium alloys, May 4, 2017, Nature, vol. 545, pp. 80-83. (Year: 2017).*
D. Chen et al., High Sensitive Dual-Phase Nanoglass-Ceramics Self-Calibrated Optical Thermometer, Mar. 3, 2016, Analytical Chemistry, vol. 88, pp. 4099-4106. (Year: 2016).*
D. Chen et al., Dual-phase nano-glass-ceramics for optical thermometry, Nov. 29, 2015, Sensors and Actuators B: Chemical, vol. 226, pp. 14-23. (Year: 2015).*
D. Chen et al., EuF3/Ga2O3 Dual-Phase Nanostructural Glass Ceramics with Eu2+/Cr3+ Dual-Activator Luminescence for Self-Calibrated Optical Thermometry, Sep. 6, 2016, J. Physical Chemistry C, vol. 120, pp. 21858-21865. (Year: 2016).*
International search report dated Jan. 17, 2019 from corresponding application No. PCT/CN2018/084086.

* cited by examiner

FLEXIBLE DISPLAY DEVICE AND MANUFACTURING METHOD THEREOF

CROSS REFERENCE TO RELATED APPLICATIONS

This application is a continuing application of PCT Patent Application No. PCT/CN2018/084086, entitled "FLEXIBLE DISPLAY DEVICE AND MANUFACTURING METHOD THEREOF", filed on Apr. 23, 2018, which claims priority to Chinese Patent Application No. 201810291537.6, filed on Apr. 3, 2018, both of which are hereby incorporated in its entireties by reference.

BACKGROUND

1. Technical Field

The present disclosure relates to flexible display field, more particularly to a flexible display device and a manufacturing method thereof.

2. Description of Related Art

Flexible display devices have become one of the important trends in the display industry due to the attribute of being able to be bent. Usually, the flexible display device is expanded or folded via the configuration of a hinge or a winding mechanism. However, the hinge and the winding mechanism include plenty of components and have complicated structures, which result in a complicated structure of the flexible display device.

SUMMARY

In one aspect, the present disclosure relates to a flexible display device, including: at least two non-bending regions and at least one bendable region configured between the two adjacent non-bending regions, wherein a stress buffering layer is configured on the bendable region, the stress buffering region is configured to buffer a stress generated from the flexible display device when the flexible display device is in a bending state.

A dimension of the stress buffering layer is greater than or equal to a dimension of the bendable region.

A dimension of the stress buffering layer is less than or equal to a dimension of the bendable region.

The flexible display device includes a flexible display body including a flexible display panel and a back plate configured to support the flexible display panel, the flexible display panel is configured on the back plate, the stress buffering layer is configured on one side of the back plate facing away the flexible display panel, and the stress buffering region is configured to buffer the stress generated from the flexible display device and a stress generated from the back plate when the flexible display device is in the bending state.

The stress buffering layer is made of metal nanomaterial, and a stiffness of the stress buffering layer is greater than a stiffness of the back plate.

The metal nanomaterial is multi-stabilized nano-structured material, and the multi-stabilized nano-structured material is configured to be a supra-nanometre-sized dual-phase glass-crystal (SNDP-GC).

An average composition of the SNDP-GC is $Mg_{49}Cu_{42}Y_9$.

A volume fraction of $MgCu_2$ in the SNDP-GC is 56 percent.

The stress buffering layer is of a layer structure, and a length of the stress buffering layer is the same with a length of the bendable region.

The stress buffering layer includes a plurality of metal components spaced apart from each other, and the plurality of the metal components are configured on the bendable region in a matrix.

The plurality of the metal components are arranged along a first direction, each of the metal components extends along a second direction, and the first direction is different from the second direction.

The metal components are configured to be metal wires, and the metal wires are of at least a wave-structure or a linear structure.

The flexible display device further includes an adhesion layer configured on the bendable region, and the stress buffering layer is attached to the bendable region via the adhesion layer.

The adhesion layer includes a plurality of grooves to form a plurality of adhering portions, and the stress buffering layer is attached to the bendable region via the plurality of the adhering portions.

The stress buffering layer is formed on the bendable region by conducting an evaporation process.

In another aspect, the present disclosure further relates to a manufacturing method of a flexible display device, including: providing a flexible display body, wherein the flexible display body includes at least two non-bending regions and at least one bendable region configured between the two adjacent non-bending regions; adhering a stress buffering layer on the bendable region to form the flexible display device.

An adhesion layer is configured on the bendable region, the adhesion layer includes a plurality of grooves to form a plurality of adhering portions, and the stress buffering layer is attached to the bendable region via the plurality of the adhering portions.

In view of the above, the present disclosure relates to the flexible display device and the manufacturing method thereof. The stress generated from the flexible display device when the flexible display device is at the bending state may be buffed by configuring the stress buffering layer on the bendable region to maintain the flexible display device in a stable state. The stress buffering layer has a simple structure, as such the structure of the flexible display device may be simplified.

DETAILED DESCRIPTION

To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments.

A flexible display device, including at least two non-bending regions and at least one bendable region configured between the two adjacent non-bending regions. A stress buffering layer is configured on the bendable region. The stress buffering layer is configured to buffer a stress generated from the flexible display device when the flexible display device is in a bending state to maintain the flexible display device to be in a stable state. The stable state indicates that a shape of the flexible display device is maintained to be in stable without deformation when the flexible display device is in the bending state, and the shape of the flexible display device is maintained to be flat without deformation when the flexible display device is in a flat state.

Figure 1:
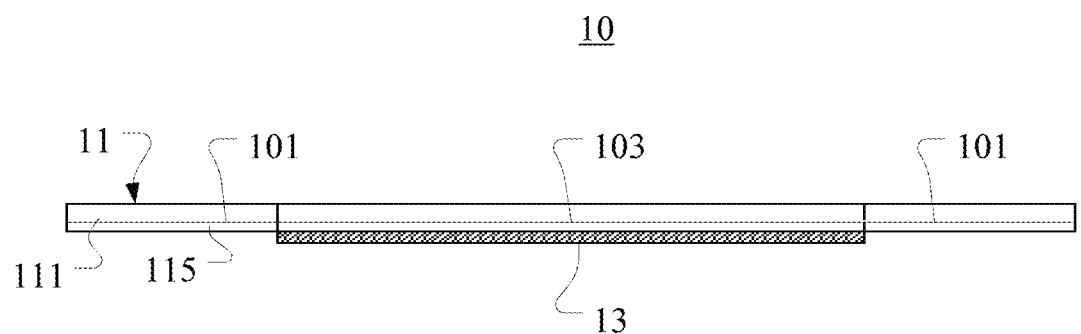
FIG. 1 is a side view of a flexible display device in accordance with first embodiment of the present disclosure.
Figure 2:
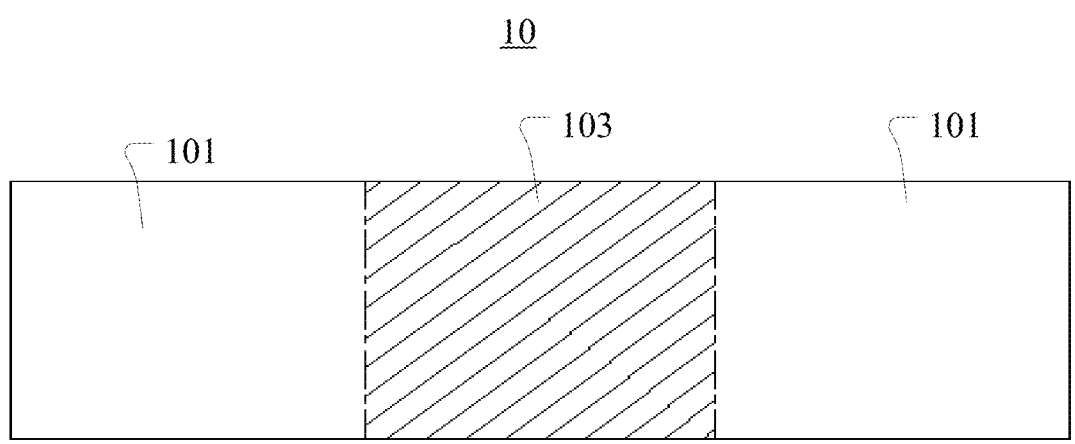
FIG. 2 is a top view of the flexible display device shown in FIG. 1.

Referring to FIG. 1 and FIG. 2, the present disclosure relates to a flexible display device 10. The flexible display device 10 includes a flexible display body 11 and a stress buffering layer 13. The flexible display body 11 includes a flexible display panel 111 and a back plate 115 configured to support the flexible display panel 111. At least two non-bending regions 101 and at least one bendable region 103 arranged between the two adjacent non-bending regions 101 are configured on the flexible display panel 111 and the back plate 115. A stress buffering layer 13 is configured on the bendable region 103. The stress buffering layer 13 is configured to buffer the stress generated from the flexible display device 10 when the flexible display device 10 is in the bending state to maintain the flexible display device 10 in the stable state.

Specifically, referring to FIG. 1 and FIG. 2, the flexible display panel 111 is configured on the back plate 115. The stress buffering layer 13 is configured on one side of the back plate 115 facing away the flexible display panel 111.

Figure 5:
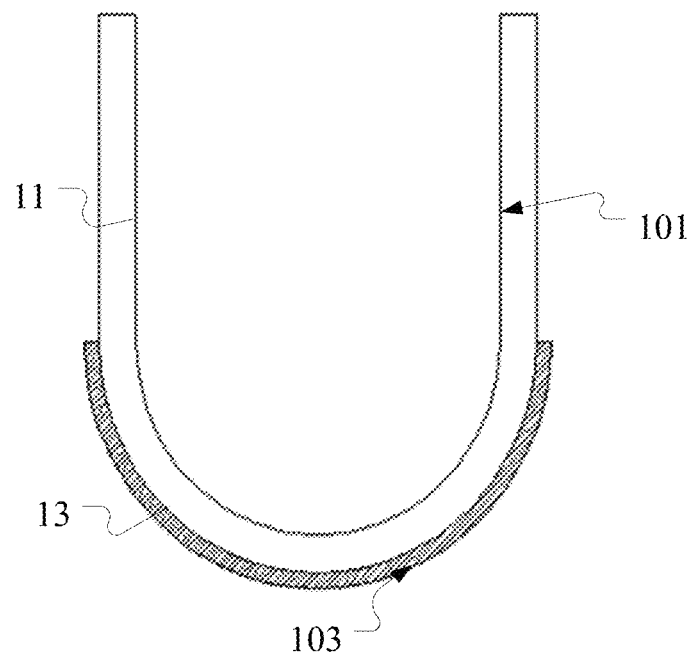
FIG. 5 is a diagram illustrating the flexible display device, shown in FIG. 1, in the bending state.

The flexible display panel device 10 may include the flat state, as shown in FIG. 1 and FIG. 2, and the bending state, as shown in FIG. 5. When the flexible display device 10 is in the flat state, the bendable region 103 is flat. When the flexible display device 10 is in the bending state, the bendable region 103 is bent.

In one example, the flexible display device 10 may include two non-bendable regions 101, and the bendable region 103 may be configured between the two non-bendable regions 101. It can be understood that number and position of the bendable region 103 and the non-bendable region 101 are changeable, such that the flexible display device 10 may be bent into different shapes.

In one example, the flexible display device 10 may include one stress buffering layer 13. A dimension of the stress buffering layer 13 is greater than or equal to a dimension of the bendable region 103. In other words, a dimension of an area of the back plate 115 where the stress buffering layer 13 is configured is greater than or equal to the dimension of the bendable region 103. The stress buffering layer 13 may be of a layer structure. The stress buffering layer 13 is attached to the back plate 115 of the bendable region 103. The flexible display panel 111, the back plate 115, and the stress buffering layer 13 are stacked in sequence. A length of the stress buffering layer 13 is the same with a length of the bendable region 103. In another example, the dimension of the stress buffering layer 13 is less than or equal to the dimension of the bendable region 103.

The stress buffering layer 13 is a continuous structure having the dimension same with the bendable region 103. In other words, the length, a width, and a shape of the stress buffering layer 13 and the bendable region 103 are the same, so as to fix and stabilize the flexible display device 10 better. It is understood that the stress buffering layer 13 may be of other shapes, such as a grid-shape.

The stress buffering layer 13 is made of metal nanomaterial. In one example, the metal nanomaterial may be multi-stabilized nano-structured material. The multi-stabilized nano-structured material may be maintained to be in flat without deformation when the flexible display device had not been bent. The multi-stabilized nano-structured material may be maintained to be in a bending shape when the flexible display device is bent into a variety of shapes. The multi-stabilized nano-structured material has great stiffness and ductility, and may be maintained to be in stable under different conditions. The multi-stabilized nano-structured material may be formed on the bendable region 103 by conducting an evaporation process. A stiffness of the stress buffering layer 13 is greater than a stiffness of the back plate 115. The stiffness is a recovering force of the multi-stabilized nano-structured material when being bent. In another example, the multi-stabilized nano-structured material may be formed on the bendable region 103 by other physical or chemical processes, such as the multi-stabilized nano-structured material may be attached to the bendable region 103 via bonding material.

In one example, the multi-stabilized nano-structured material is configured to be a supra-nanometre-sized dual-phase glass-crystal (SNDP-GC). The supra-nanometre-sized dual-phase glass-crystal is configured to combine strengthen the advantages of nanocrystal material and non-crystal amorphous material. The supra-nanometre-sized dual-phase glass-crystal has a great toughness under a room temperature, and solves the problems generated by size effect of the sample the supra-nanometre-sized dual-phase glass-crystal may reduce a size of a sample. A limited stress of the supra-nanometre-sized dual-phase glass-crystal is 3.3 GPa. Thus, a shape of the supra-nanometre-sized dual-phase glass-crystal may be maintained when a high tensional stress is conducted on. MgCu2 grains in a diameter of 6 nm are uniformly embedded into magnesium-rich amorphous shells in a thickness substantially at 2 nm by a magnetron sputtering process to obtain the supra-nanometre-sized dual-phase glass-crystal having an amorphous/nanocrystal dual phase structure. MgCu2 nanocrystal has a low dislocation density and a high low-energy-state stability. An average composition of the supra-nanometre-sized dual-phase glass-crystal is Mg49Cu42Y9, and a volume fraction of MgCu2 in the supra-nanometre-sized dual-phase glass-crystal is 56 percent. When a strain occurs, a dual-phase structure of the supra-nanometre-sized dual-phase glass-crystal is configured to prevent a local shear band from transmitting, and in any shear band that has occurred, the embedded grains may split and rotate, which facilitates the strengthening of the material and resists the softening effect in the shear band.

Referring to FIG. 1 and FIG. 2, when the flexible display device 10 is in the flat state, the bendable region 103 is flat. An angle formed by the two non-bendable region 101 is substantially 180 degrees. When the flexible display panel 111 is flat, the stress buffering layer 13 maintains the flexible display body 11 within the bendable region 103 to be in the flat state without bending deformation. In other words, the stress buffering layer 13 is configured to maintain the flexible display device 10 to be in the stable state when the flexible display device 10 is in the flat state.

Figure 3:
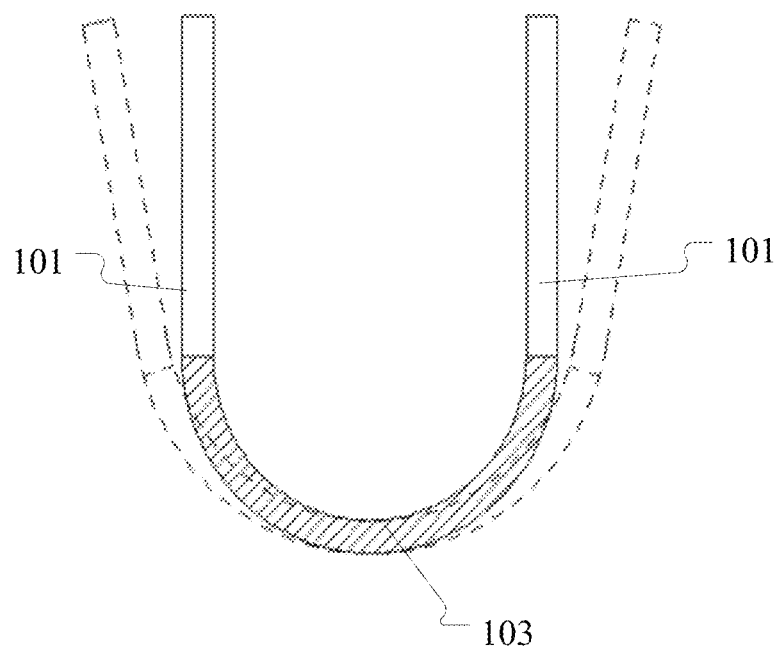
FIG. 3 is a diagram illustrating the flexible display device, shown in FIG. 1, in a bending state.
Figure 4:
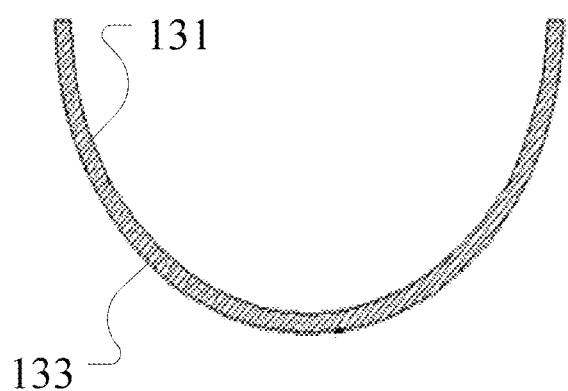
FIG. 4 is a diagram illustrating a stress buffering layer of the flexible display device in the bending state.

The bendable region 103 is bent. Referring to FIG. 3 to FIG. 5, when the stress buffering layer 13 and the bendable region 103 are bent into an arc-shape substantially in 180 degrees, an angle formed by the two non-bendable region 101 is substantially 0 degree. Under this bending state (even if a bending force is removed), due to the fact that the stiffness of the stress buffering layer 13 is greater than a stiffness of the flexible display body 11, and that the stress buffering layer 13 may resist the flexible display panel 111 from recovering to an original shape, the bendable region 103 of the flexible display panel 111 may be maintained to be of the arc-shape substantially in 180 degrees. The flexible display device 10 is in a force-balance state. A compressive stress conducted on an inner side 131 of one side of the stress buffering layer 13 close to the flexible display panel 111 is substantially zero, that is, a resultant force of the inner side 131 of the stress buffering layer 13 resulting from the stress buffering layer 13 is substantially zero. The tensional stress conducted on an outer side 133 of one side of the stress buffering layer 13 facing away the flexible display panel 111 is substantially zero, that is, a resultant force of the outer side 133 of the stress buffering layer 13 resulting from the stress buffering layer 13 is substantially zero. In other words, the stress buffering layer 13 is configured to maintain the flexible display device 10 to be in the stable state when the flexible display device 10 is in the bending state.

As shown in FIG. 1, the stress buffering layer 13 made of multi-stabilized nano-structured metal components is configured on the bendable region 103 of a bottom of the flexible display device 10. The flexible display panel and the multi-stabilized nano-structured metal components are stable in the flat state (zero degree). The multi-stabilized nano-structured metal of a semicircular structure, as shown in FIG. 4, may be maintained to be in the stable state due to the multi-stabilized nano-structured material has the great stiffness and the ductility. That is, the compressive stress of the inner side surface 131 (the inner circle shown in FIG. 4) of the stress buffer layer 13 is substantially zero, and the tensional stress of the outer surface 133 (the outer circle shown in FIG. 4) of the stress buffer layer 13 is substantially zero. As shown in FIG. 5, the multi-stabilized nano-structured metal components are attached to the outer side (lower portion) of the flexible display panel. After the flexible display panel is bent to 90 degrees from the flat state, the metal components may be in the stable state. The flexible display panel is at the stable state with two sides opened. The stiffness of the multi-stabilized nano-structured metal component in the stable state is greater than the stiffness of the flexible display panel, and the shape of the flexible display panel may be maintained to be the same with the multi-stabilized nano-structured metal component, and the flexible display device 10 may be in the stable state. As such, the entire flexible display device (including the flexible display panel and the multi-stabilized nano-structured metal component) may be in the stable (balanced) state.

It is noted that the flexible display device may not only be in the stable state without deformation when the bendable region 103 is flat or when the bendable region 103 is bent into the arc-shape substantially in 180 degrees, the flexible display device but also may be in the stable state when the bendable region 103 is bent into other shapes, such as a S-shape, or being bent into other regular or irregular shapes. The stress buffer layer 13 is configured to maintain the flexible display body 11 to be at the bending shape. The stress buffer layer 13 is made of one single layer of the multi-stabilized nano-structured material, which is a simple structure, thereby simplifying the structure of the flexible display device 10.

In one example, the stress buffer layer 13 within the bendable region 103 is adhered to the back plate 115 via an adhesive layer (not shown). The adhesive layer may be a double-sided pressure sensitive adhesive (PSA). The adhesive layer may include at least one groove, and at least one portion of the stress buffer layer 13 may not be adhered to the back plate 115. As such, the ductility of the stress buffer layer 13 may be guaranteed, thereby facilitating the bending of the flexible display device 10.

Figure 6:
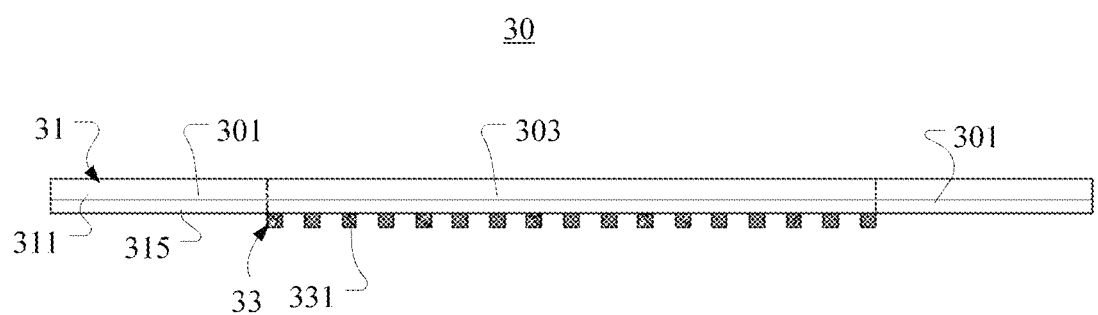
FIG. 6 is a side view of a flexible display device in accordance with second embodiment of the present disclosure.

Referring to FIG. 6, the present disclosure relates to a flexible display device 30. The flexible display device 30 includes a flexible display body 31 and a stress buffering layer 33. At least two non-bending regions 301 and at least one bendable region 303 configured between the two adjacent non-bending regions 301 are configured on the flexible display body 31. A stress buffering layer 33 is configured on the bendable region 303.

The stress buffering layer 33 includes a plurality of metal components 331 spaced apart from each other, and the metal components 331 are of a sheet-shape. Specifically, the plurality of the metal components 331 are arranged along a first direction, and each of the metal components extends 331 along a second direction. As such, the metal components 331 are configured on the bendable region 303 in a matrix. In one example, the first direction is different from the second direction.

In another example, the plurality of the metal components 331 may not be arranged along the first direction, and each of the metal components 331 may not extend along the second direction. That is, the metal components 331 are separately arranged on the bendable region 303. Such that the flexible display device 30 may be in stable, and the cost may be reduced.

Referring to FIG. 6, when the bendable region 303 is in the flat state, an angle formed by the two non-bendable region 301 is substantially 180 degrees. When the flexible display panel 311 is flat, the stress buffering layer 33 is configured to maintain the flexible display body 31 in the stable state without deformation.

Figure 7:
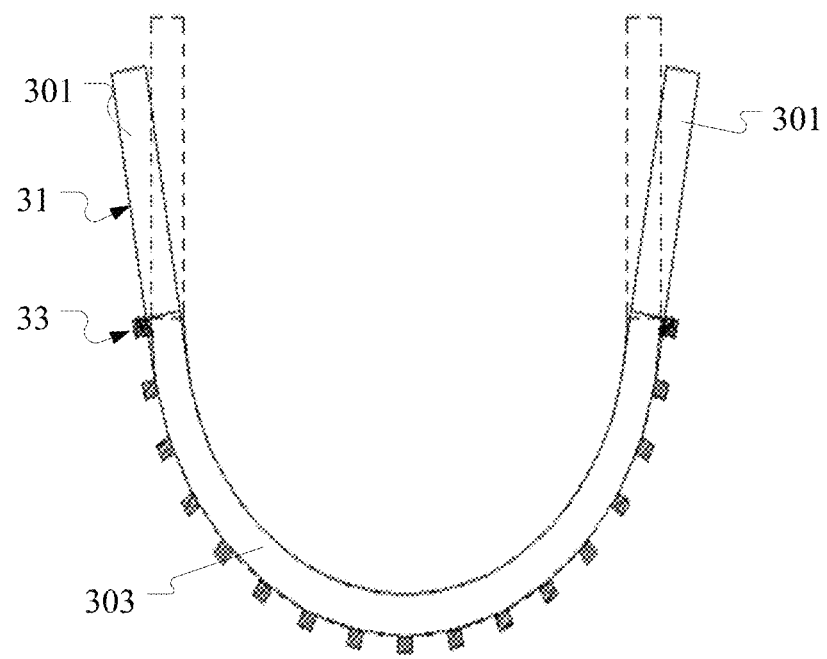
FIG. 7 is a diagram illustrating the flexible display device, shown in FIG. 6, in the bending state.
Figure 8:
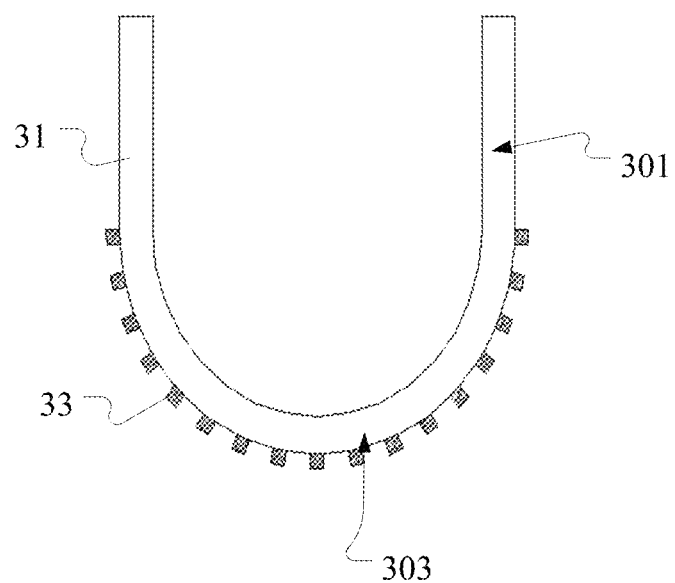
FIG. 8 is a diagram illustrating the flexible display device, shown in FIG. 7, in the bending state.
Figure 9:
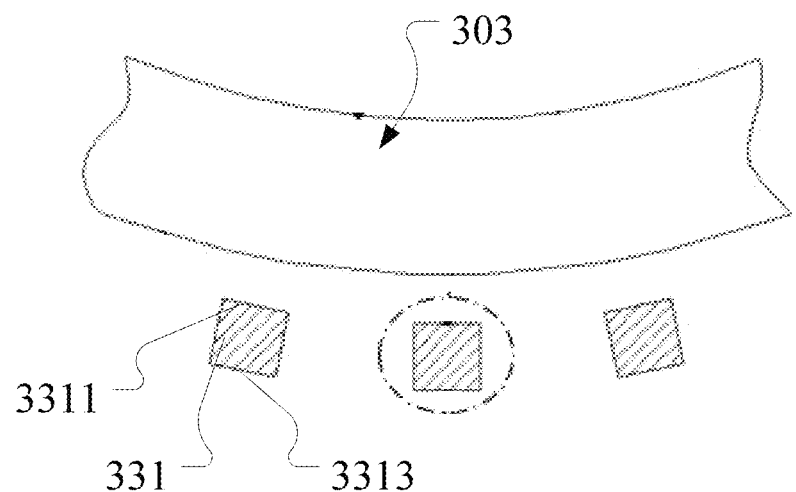
FIG. 9 is a partial decomposition diagram of the flexible display device.

Referring to FIG. 7, the bendable region 103 is bent. Referring to FIG. 8, when the bendable region 303 is bent into the arc-shape substantially in 180 degrees, the angle formed by the two non-bendable region 301 of the flexible display panel 311 is substantially 0 degree. Further referring to FIG. 9, under this bending state, the stiffness of the stress buffering layer 33 is greater than the stiffness of a back plate 315 of the flexible display body 31, and the stress buffering layer 33 may resist the flexible display body 31 from recovering to the original shape. The flexible display device 30 is in the force-balance state. The compressive stress conducted on an inner side 3311 of one side of the metal components 331 close to the flexible display body 31 is substantially zero, that is, a resultant force on the inner side 3311 of the metal components 331 from the metal components 331 is substantially zero. The tensional stress conducted on an outer side 3313 of one side of the metal components 331 facing away the flexible display body 31 is substantially zero, that is, a resultant force of the outer side 3313 of the metal components 331 from the metal components 331 is substantially zero. As such, the bendable region 303 of the flexible display body 31 may be maintained to be in the arc-shape substantially in 180 degrees.

The stress buffering layer 33 made of the multi-stabilized nano-structured metal components is configured on the bendable region 303 of a bottom of the flexible display device 30. The multi-stabilized nano-structured metal may be formed on a bottom of the flexible display body by conducting the evaporation process. The multi-stabilized nano-structured metal may be non-continuous, and may be a plurality of discrete metal sheets spaced apart from each other in a predetermined distance. The more the number of the discrete metal sheets is, the closer the shape of the fixed bendable region to be in a circle when the flexible display body 31 is bent. The stable state (0 degree) indicates the flexible display body 31 and the multi-stabilized nano-structured metal components are stable. The multi-stabilized nano-structured metal is of the arc-shape, i.e., the stress buffering layer 33 is of the arc-shape. The multi-stabilized nano-structured metal may be maintained to be in the stable state when multi-stabilized nano-structured metal is bent within an angle range from 0 to 90 degrees by different designs of an internal atomic structure of each of the discrete metal sheets. That is, the stress on the inner side of each of the discrete metal sheets (metal components) is substantially zero, and the stress on the inner side is also substantially zero. That is, each of the discrete metal sheets is in the stable state. As shown in FIG. 6 and FIG. 7, the plurality of the discrete metal sheets are plated on the outer side (lower portion) of the flexible display main body 31. When the flexible display main body 31 is bent to 90 degrees from the flat state, each of the discrete metal sheets may be maintained to be in the stable state by the design of the internal atomic structure of each of the discrete metal sheets. The flexible display body is in the stable state with two sides opened. Due to the fact that the stiffness of the multi-stabilized nano-structured metal components 331 is greater than the stiffness of the flexible display body 31, the shape of the flexible display body 31 may be maintained to be the same with the metal components. As such, the flexible display body 31 may be in the stable state, and the entire flexible display panel (including the flexible display body and the plurality of the discrete metal sheets plated on the flexible display body) may be in the stable (balanced) state.

It is noted that the flexible display device 30 may not only be in the stable state without deformation when the bendable region 303 is flat or when the bendable region 303 is bent into the arc-shape substantially in 180 degrees, the flexible display device but also may be in the stable state when bendable region 303 is bent into other shapes, such as the S-shape, or being bent into other regular or irregular shapes. The stress buffer layer 33 is configured to maintain the flexible display panel 311 to be at the bending shape. The stress buffer layer 33 is made of one single layer of the multi-stabilized nano-structured material, which is a simple structure, thereby simplifying the structure of the flexible display device 30.

In one example, each of the metal components 311 is adhered on the flexible display body 31 via at least two adhering portions. That is, at least two adhering portions are configured between each of the metal components 311 and the flexible display body 31. One groove is formed between the two adhesive regions, such that at least one portion of the metal component 311 may not be adhered to the flexible display body 31. As such, the ductility of the metal components 311 may be improved.

Figure 10:
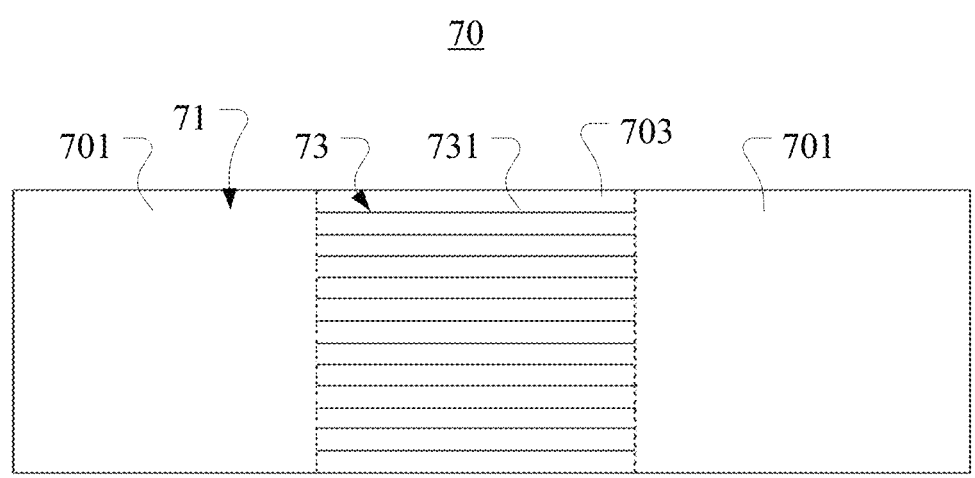
FIG. 10 is a diagram illustrating a flexible display device in accordance with third embodiment of the present disclosure.

Referring to FIG. 10, the present disclosure relates to a flexible display device 70. The flexible display device 70 includes a flexible display body 71 and a stress buffering layer 73 configured on the flexible display body 71. The flexible display body 71 includes at least two non-bending regions 701 and at least one bendable region 703 configured between the two adjacent non-bending regions 701. A stress buffering layer 73 is configured on the bendable region 703.

The stress buffering layer 73 of the flexible display device 70 may include a plurality of metal components 731. In one example, the metal components 731 may be metal wires. The metal components 731 may be made of the multi-stabilized nano-structured material described in above.

In one example, the metal components 731 may be of a linear structure. An extending direction of the metal components 731 is the same with a bending direction of the flexible display device 70 when the flexible display device 70 is in the bending state.

Figure 11:
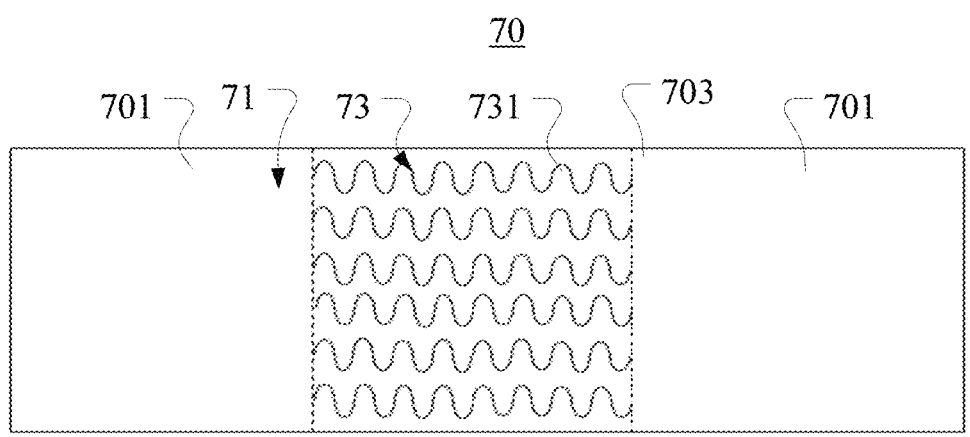
FIG. 11 is a diagram illustrating a flexible display device in accordance with one embodiment of the present disclosure.

In one example, referring to FIG. 11, the metal components 731 may be of a wave-structure. The metal components 731 may adopt the wave-structure similar to a shape of a spring, or the metal components 731 of the linear shape may be obtain by a fractal design. The wave-structure may also be obtained by the fractal design. The fractal design has a feature that a space is filled up by a non-integer format, and it is usually defined as "a rough or a fragmented geometric shape that can be divided into several portions, and each of the portions (at least approximately) is a reduced shape of the overall shape", i.e., it has a self-similar property. It is understood that the metal components 731 may be designed in other shapes, such as trapezoidal and triangular. The wave-structure design and the fractal design may improve the ductility of the metal components 731. As such, fracture problems in the metal component 731 resulting from a changing of a curvature of the metal component 731 when bending the bendable region 703 may be avoided, the bending of the flexible display device 70 may be facilitated, and the life cycle of the stress buffering layer 73 may be extended. The extending direction of the metal component 731 is the same with the bending direction of the flexible display panel 711.

Figure 12:
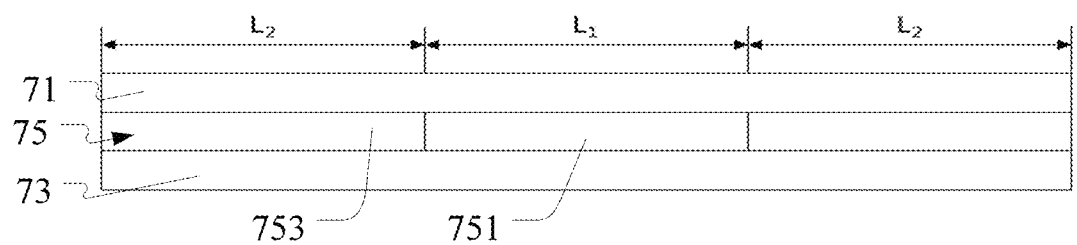
FIG. 12 is a diagram illustrating one metal component configured on a bendable portion of the flexible display device.

Referring to FIG. 12, the flexible display device 70 further includes an adhesion layer 75. The adhesion layer 75 may include a plurality of grooves 751 to form a plurality of adhering portions 753 configured to adhere the metal components 731 onto the flexible display body 71. The stress buffering layer 73, the adhesion layer 75, and the adhering portion 753 are stacked in sequence.

Specifically, each of the metal components 731 is attached to the flexible display body 71 via the at least two adhering portions 753. In other words, at least two adhering portions 753 are configured between each of the metal components 731 and the flexible display body 71. One groove 751 is formed between the two adhering portions 753. The at least two adhering portions 753 are configured within the same layer. The metal components 731 are adhered to the adhering portion 753. The adhering portion 753 may be made of PSA. As such, at least one portion of the metal component 731 is not adhered to the flexible display body 71, and the ductility of the metal components 731 may be improved.

Figure 13:
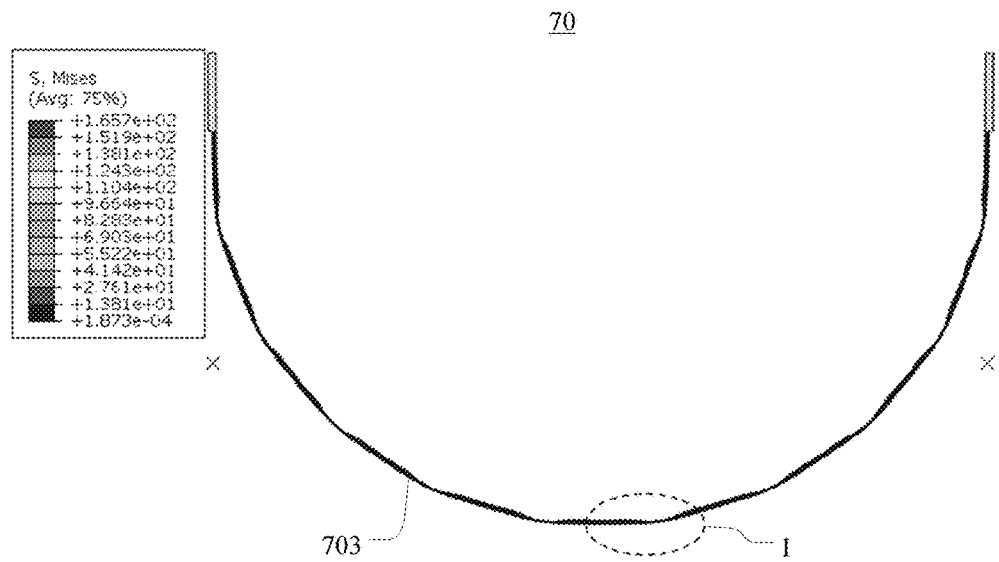
FIG. 13 is a diagram illustrating a stress of the flexible display device when the flexible display device is bent.
Figure 14:
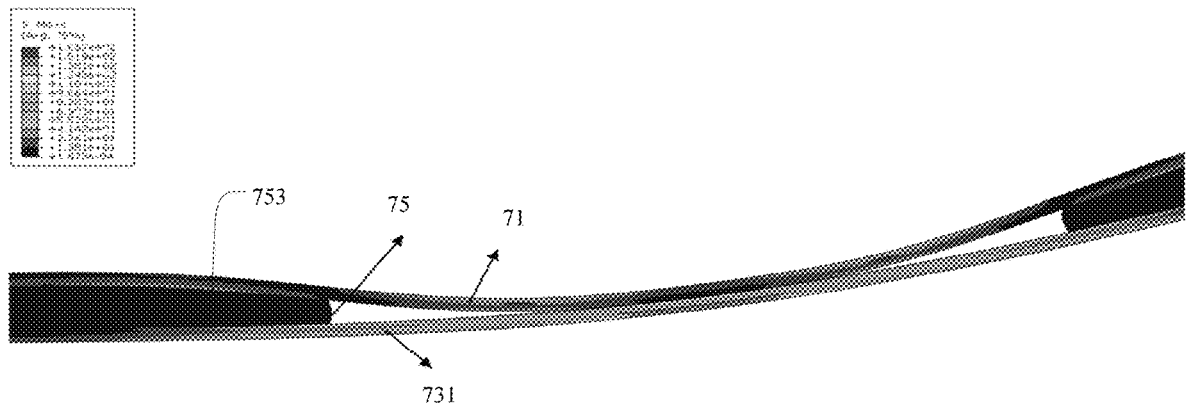
FIG. 14 is a diagram illustrating a stress of a local area "I" of the flexible display device shown in FIG. 13.

In one example, a length of the each of the adhering portions is configured to be as "L2", and a length of the groove 751 between the two adhering portions 753 is configured to be as "L1". As such, the ductility of the metal components 731 may be improved. Referring to FIG. 13 and FIG. 14, FIG. 13 is a diagram illustrating the stress of the flexible display device 70 when the flexible display device 70 is in the bending state. In one example, a bending radius of the bendable region 703 of the flexible display device 70 is configured to be 3 mm. FIG. 14 is a diagram illustrating the stress of a local area "I" of the flexible display device 70 shown in FIG. 13. The deeper the color is, the smaller the stress is. Due to the buffering of the adhering portion 753, the stress on a portion where the metal components 731 and the adhering portion 753 are adhered is smaller than stress on a portion (corresponding to the groove 751) where the metal components 731 and the adhering portion 753 are not adhered.

Figure 15:
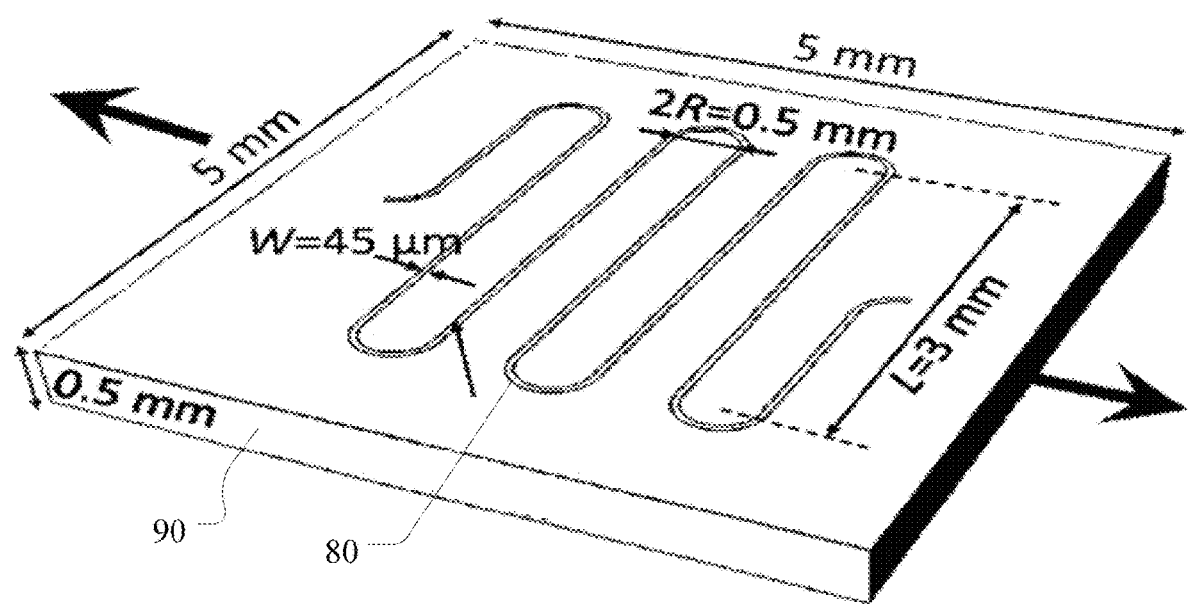
FIG. 15 is a schematic view illustrating wave-structured metal wires configured on a flexible substrate.
Figure 16:
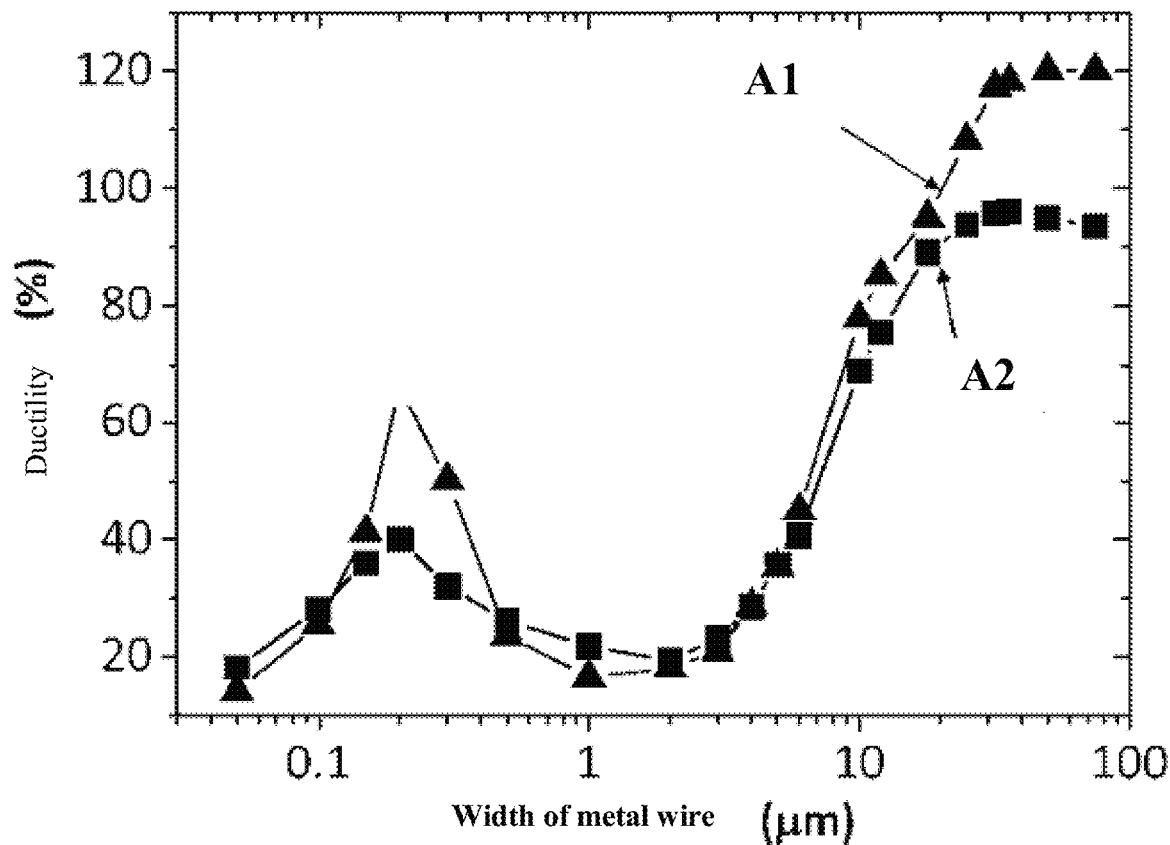
FIG. 16 is a curve diagram illustrating a ductility of a metal wire configured on a flexible substrate.

Refer to FIG. 15 and FIG. 16 to better explain the ductility of the metal wire. FIG. 15 is a schematic view illustrating wave-structured metal wires 80 configured on a flexible substrate 90. FIG. 16 is a curve diagram illustrating a ductility of a metal wire configured on a flexible substrate, wherein a curve A1 indicates the ductility of a linear metal wire is a function of a thickness, and a curve A2 indicates the ductility of a wave-structure metal wire is a function of a thickness. As shown in FIG. 16, a thickness "t" of the metal wire may affect the ductility of the metal wire. For example, when 0.02 $\mu m \leq t \leq 0.2$ $\mu m$, with the increase of the thickness "t", the ductility of the linear metal wire and the wave-structure metal wire are improved. When 0.2 $\mu m \leq t \leq 1$ $\mu m$, with the increase of the thickness "t", the ductility of the linear metal wire and the wave-structure metal wire are reduced. When 2 $\mu m \leq t \leq 50$ $\mu m$ with the increase of the thickness "t", the ductility of the linear metal wire and the wave-structure metal wire are improved. In some certain intervals, such as when 2 $\mu m \leq t \leq 50$ $\mu m$, the ductility of the wave-structure metal wire is much greater than that of the linear metal wire.

Figure 17:
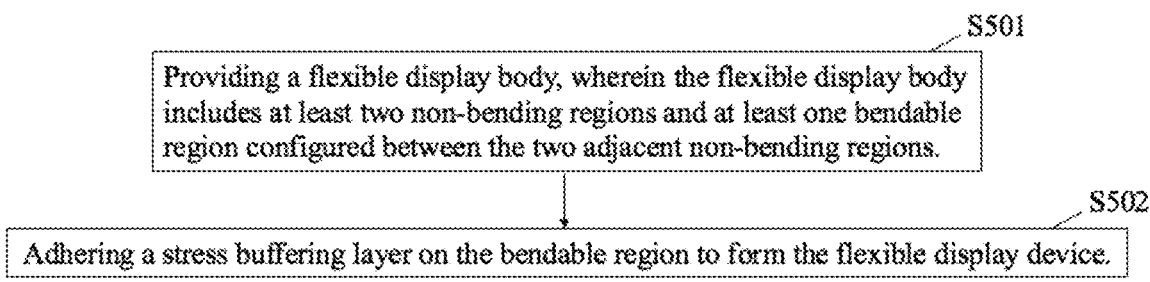
FIG. 17 is a flowchart illustrating a manufacturing method of a flexible display device in accordance with one embodiment of the present disclosure.

Referring to FIG. 17, the present disclosure further relates to a manufacturing method of the flexible display device, including the following steps.

In step S501, providing a flexible display body, wherein the flexible display body includes at least two non-bending regions and at least one bendable region configured between the two adjacent non-bending regions.

In step S502, adhering a stress buffering layer on the bendable region to form the flexible display device, wherein an adhesion layer is configured on the bendable region, and the adhesion layer includes a plurality of grooves to form a plurality of adhering portions, the stress buffering layer is attached to the bendable region via the plurality of the adhering portions, the stress buffering region is configured to buffer a stress generated from the flexible display device when the flexible display device is in a bending state, so as to maintain the flexible display device to be in a stable state.

In one example, the stress buffering layer may include the plurality of the metal components, and each of the metal components is adhered to the flexible display device via the at least two adhering portions.

In view of the above, the present disclosure relates to the flexible display device and the manufacturing method thereof. The stress buffering layer is configured on the bendable region. The stress buffering layer is configured to maintain the flexible display device to be in the stable state when the flexible display device is in the bending state. The stress buffering layer may have a simple structure, as such the structure of the flexible display device may be simplified, and the thickness and weight of the flexible display device may be reduced.

Since the metal component (stress buffering layer) is added on the bottom of the flexible display body, the metal component is made of the multi-stabilized nano-structured material, and the multi-stabilized nano-structured material has excellent stiffness and ductility, the metal component may be maintained to be at the stable state under different bending conditions. That is, the rigidity and the stable state of the metal components allow the flexible display body to maintain to be in the stable state when the flexible display body is bent. The flexible display body may be bent within a predetermined bending region, and may be maintained to be in the stable state under different bending conditions. In other words, the flexible display device may be maintained to be in the bending state when users release their hands. As such, the additional hinge structure may be omitted, the bending of the flexible display body may be achieved, and the thickness of organic light-emitting diode (OLED) cellphones may be greatly reduced.

All other embodiments obtained by a person of ordinary skill in the art based on the embodiments of the present disclosure without creative efforts shall fall within the protection scope of the present disclosure.

What is claimed is:

1. A flexible display device, comprising:
at least two non-bending regions and at least one bendable region configured between the two adjacent non-bending regions, wherein a stress buffering layer is configured on the bendable region, the stress buffering layer is configured to buffer a stress generated from the flexible display device when the flexible display device is in a bending state;
wherein the flexible display device comprises a flexible display body comprising a flexible display panel and a back plate configured to support the flexible display panel, the flexible display panel is configured on the back plate, the stress buffering layer is configured on one side of the back plate facing away the flexible display panel, and the stress buffering layer is configured to buffer the stress generated from the flexible display device and a stress generated from the back plate when the flexible display device is in the bending state;
wherein the stress buffering layer is made of metal nanomaterial, and a stiffness of the stress buffering layer is greater than a stiffness of the back plate;
wherein the metal nanomaterial is multi-stabilized nano-structured material, and the multi-stabilized nano-structured material is configured to be a supra-nano-metre-sized dual-phase glass-crystal (SNDP-GC).

2. The flexible display device according to claim 1, wherein a dimension of the stress buffering layer is greater than or equal to a dimension of the bendable region.

3. The flexible display device according to claim 1, wherein a dimension of the stress buffering layer is less than or equal to a dimension of the bendable region.

4. The flexible display device according to claim 1, wherein an average composition of the SNDP-GC is $Mg_{49}Cu_{42}Y_9$.

5. The flexible display device according to claim 4, wherein a volume fraction of $MgCu_2$ in the SNDP-GC is 56 percent.

6. The flexible display device according to claim 1, wherein the stress buffering layer is of a layer structure, and a length of the stress buffering layer is the same with a length of the bendable region.

7. The flexible display device according to claim 1, wherein the stress buffering layer comprises a plurality of metal components spaced apart from each other, and the plurality of the metal components are configured on the bendable region in a matrix.

8. The flexible display device according to claim 7, wherein the plurality of the metal components are arranged along a first direction, each of the metal components extends along a second direction, and the first direction is different from the second direction.

9. The flexible display device according to claim 7, wherein the metal components are configured to be metal wires, and the metal wires are of at least a wave-structure or a linear structure.

10. The flexible display device according to claim 1, wherein the flexible display device further comprises an adhesion layer configured on the bendable region, and the stress buffering layer is attached to the bendable region via the adhesion layer.

11. The flexible display device according to claim 10, wherein the adhesion layer comprises a plurality of grooves to form a plurality of adhering portions, and the stress buffering layer is attached to the bendable region via the plurality of the adhering portions.

12. The flexible display device according to claim 1, wherein the stress buffering layer is formed on the bendable region by conducting an evaporation process.

13. A manufacturing method of a flexible display device, comprising:
    providing a flexible display body, wherein the flexible display body comprises at least two non-bending regions and at least one bendable region configured between the two adjacent non-bending regions; and
    adhering a stress buffering layer on the bendable region to form the flexible display device;
    wherein the stress buffering layer is made of metal nanomaterial;
    wherein the metal nanomaterial is multi-stabilized nano-structured material, and the multi-stabilized nano-structured material is configured to be a supra-nano-metre-sized dual-phase glass crystal (SNDP-GC).

14. The manufacturing method according to claim 13, wherein an adhesion layer is configured on the bendable region, the adhesion layer comprises a plurality of grooves to form a plurality of adhering portions, and the stress buffering layer is attached to the bendable region via the plurality of the adhering portions.

15. The manufacturing method according to claim 14, wherein the stress buffering layer comprises a plurality of metal components spaced apart from each other, and each of the metal components is attached to the flexible display device via at least two adhering portions of the plurality of adhering portions.

\* \* \* \* \*